United States Patent
Chien et al.

(10) Patent No.: US 9,584,304 B2
(45) Date of Patent: Feb. 28, 2017

(54) PHASE INTERPOLATOR AND CLOCK AND DATA RECOVERY CIRCUIT

(71) Applicants: Global Unichip Corporation, Hsinchu (TW); Taiwan Semiconductor Manufacturing Co., Ltd., Hsin-Chu (TW)

(72) Inventors: Ting-Hsu Chien, Hsinchu (TW); Yi-Lin Lee, Hsinchu (TW); Ju-Chieh Wang, Hsinchu (TW)

(73) Assignees: Global Unichip Corporation, Hsinchu (TW); Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/672,251

(22) Filed: Mar. 30, 2015

(65) Prior Publication Data
US 2016/0294538 A1    Oct. 6, 2016

(51) Int. Cl.
*H04L 7/00*    (2006.01)
*H04L 7/033*    (2006.01)

(52) U.S. Cl.
CPC .......... *H04L 7/0025* (2013.01); *H04L 7/0331* (2013.01)

(58) Field of Classification Search
CPC ... G06F 1/04; H03D 1/04; H03D 3/24; H03D 13/00; H03H 11/16; H03H 11/26; H03K 3/00; H03K 3/017; H03K 4/06; H03K 5/00; H03K 5/13; H03L 7/00; H03L 7/06; H04L 7/00; H04L 7/0025; H04L 7/0331; H04L 12/26; H04L 25/00; H04L 27/01

(Continued)

(56) References Cited

U.S. PATENT DOCUMENTS

| | | | | |
|---|---|---|---|---|
| 5,216,374 A | * | 6/1993 | George | ..... H03L 7/00 327/105 |
| 6,380,783 B1 | * | 4/2002 | Chao | ..... H03K 5/08 327/239 |

(Continued)

FOREIGN PATENT DOCUMENTS

| | | |
|---|---|---|
| CN | 103297034 | 9/2013 |
| TW | 201315155 | 4/2013 |

OTHER PUBLICATIONS

N. Kalantari: "Dual Loop Clock and Data Recovery", Jun. 12, 2013.*

*Primary Examiner* — Shawkat M Ali
(74) *Attorney, Agent, or Firm* — Jianq Chyun IP Office

(57) ABSTRACT

A phase interpolator including a phase interpolation circuit, a plurality of low pass filtering channels, and a multiplexing circuit is provided. The phase interpolation circuit receives a first clock signal and a second clock signal and accordingly performs an interpolation operation to generate an output clock signal. The low pass filtering channels respectively have an output terminal and an input terminal that is coupled to the phase interpolation circuit to receive the output clock signal. Each of the low pass filtering channels includes a switch and a capacitor which are coupled to a common node as the output terminal. The multiplexing circuit has a plurality of input terminals respectively coupled to the output terminals of the low pass filtering channels. The multiplexing circuit selects an input signal received from one of the low pass filtering channels as a phase interpolation signal according to a selecting signal.

17 Claims, 2 Drawing Sheets

(58) Field of Classification Search
USPC ... 327/3, 146, 158, 175, 233, 247, 285, 291,
327/355; 341/143; 370/216; 375/229,
375/233, 371, 373, 376
See application file for complete search history.

(56) References Cited

U.S. PATENT DOCUMENTS

| | | |
|---|---|---|
| 7,196,564 B2 | 3/2007 | Rajagopal et al. |
| 2003/0123594 A1* | 7/2003 | Glenn ................. H04L 7/033 375/373 |
| 2010/0079180 A1* | 4/2010 | Kim ..................... H03K 5/13 327/158 |
| 2011/0050312 A1* | 3/2011 | Fujino ................. H03K 5/13 327/237 |
| 2013/0336378 A1* | 12/2013 | Agrawal ............. H04L 27/01 375/233 |
| 2014/0321577 A1* | 10/2014 | Kuttner ............. H04L 27/20 375/302 |

* cited by examiner

PHASE INTERPOLATOR AND CLOCK AND DATA RECOVERY CIRCUIT

BACKGROUND

Field of Invention

The invention generally relates to a phase interpolator; more particularly, the invention relates to a phase interpolator and a clock and data recovery circuit using the same, so as to obtain a wide operation frequency range without reducing the maximum operation speed due to parasitic capacitive effects.

Description of Prior Art

Clock and data recovery (CDR) circuits are generally used to sample an input data signal, extract the clock from the input data signal, and retime the sampled data in the receiver. In a conventional CDR circuit, a phase interpolator for adjusting the phase of the sampling clock is frequently employed.

Since the operation frequency range and the operation speed of the receiver are critically affected by circuit characteristics of the phase interpolator, designer may need more time to develop a trade-off between the operation frequency range and the operation speed, whereas it is rather difficult to ensure the performance of both.

For example, in a conventional phase interpolator design, the operation frequency range can be increased by additionally arranging a switch capacitor array (SCA) at an output terminal. However, the effective capacitance at the output terminal of the phase interpolator may be increased because of parasitic capacitance caused by the SCA, and thus the maximum operation speed of the phase interpolator may be reduced.

SUMMARY

The invention is directed to a phase interpolator and a clock and data recovery circuit, where the phase interpolator is capable of obtaining a wide operation frequency range without reducing the maximum operation speed.

The invention is directed to a phase interpolator including a phase interpolation circuit, a plurality of low pass filtering channels, and a multiplexing circuit. The phase interpolation circuit receives a first clock signal and a second clock signal and accordingly performs an interpolation operation to generate an output clock signal. The low pass filtering channels respectively have an output terminal and an input terminal that is coupled to the phase interpolation circuit to receive the output clock signal, and each of the low pass filtering channels includes a switch and a capacitor. The switch and the capacitor are coupled to a common node as the output terminal, and the switch is controlled by a corresponding switch signal. The multiplexing circuit has a plurality of input terminals respectively coupled to the output terminals of the low pass filtering channels. The multiplexing circuit selects an input signal received from one of the low pass filtering channels as a phase interpolation signal according to a selecting signal.

In an embodiment of the invention, the phase interpolator further includes a control circuit coupled to the low pass filtering channels and the multiplexing circuit, and the control circuit provides the switch signals and the selecting signal.

In an embodiment of the invention, when the multiplexing circuit selects the input signal received from one of the low pass filtering channels as the phase interpolation signal according to the selecting signal, the switch of the one of the low pass filtering channels is turned on in response to the corresponding switch signal, and the switches of the rest of the low pass filtering channels are turned off in response to the corresponding switch signals.

In an embodiment of the invention, each of the low pass filtering channels includes a switch and a capacitor. The switch has a first terminal coupled to the phase interpolation circuit, a second terminal coupled to the corresponding input terminal of the multiplexing circuit, and a control terminal receiving the corresponding switch signal. The capacitor has a first terminal and a second terminal, the first terminal of the capacitor is coupled to the second terminal of the switch and the input terminal of the multiplexing circuit, and the second terminal of the capacitor is coupled to a ground terminal.

In an embodiment of the invention, the capacitors of the low pass filtering channels have different capacitance.

In an embodiment of the invention, when the phase interpolation circuit receives the first and the second clock signals with a first frequency, the switch coupled to the capacitor with a first capacitance is turned on in response to the corresponding switch signal, and when the phase interpolation circuit receives the first and the second clock signals with a second frequency higher than the first frequency, the switch coupled to the capacitor with a second capacitance lower than the first capacitance is turned on in response to the corresponding switch signal.

In an embodiment of the invention, the phase interpolator further includes a direct transmission channel. The direct transmission channel is coupled between the phase interpolation circuit and the multiplexing circuit and directly transmits the output clock signal to the corresponding input terminal of the multiplexing circuit.

In an embodiment of the invention, when the phase interpolation circuit receives the first and the second clock signals with a third frequency higher than the second frequency, the switches of the low pass filtering channels are turned off in response to the corresponding switch signals, such that the output clock signal is provided to the input terminal of the multiplexing circuit via the direct transmission channel.

The invention is directed to a clock and data recovery (CDR) circuit including a phase detector, a finite state machine, and a phase interpolator. The phase detector compares an input data signal with a phase interpolation signal and generates a phase indication signal to indicate a phase difference between the input data signal and the phase interpolation signal. The finite state machine is coupled to the phase detector and generates a control signal according to the phase indication signal and the phase interpolation signal. The phase interpolator is coupled to the phase detector and the finite state machine and generates the phase interpolation signal according to a first clock signal, a second clock signal, and the control signal. The phase interpolator includes a phase interpolation circuit, a plurality of low pass filtering channels, and a multiplexing circuit. The phase interpolation circuit receives the first clock signal and the second clock signal and accordingly performs an interpolation operation to generate an output clock signal. The low pass filtering channels respectively have an output terminal and an input terminal that is coupled to the phase interpolation circuit to receive the output clock signal, and each of the low pass filtering channels includes a switch and a capacitor. The switch and the capacitor are coupled to a common node as the output terminal, and the switch is controlled by a corresponding switch signal. The multiplexing circuit has a plurality of input terminals respectively coupled to the output terminals of the low pass filtering channels. The multiplexing circuit selects an input signal received from one of the low pass filtering channels as a phase interpolation signal according to a selecting signal.

In an embodiment of the invention, the CDR circuit further includes a phase-locked loop (PLL). The PLL is coupled to the phase interpolator and generates the first and the second clock signals Accordingly, the embodiments of the invention provide a phase interpolator and a clock and data recovery circuit using the same. Because of the circuit structure of a plurality of low pass filtering channels in the phase interpolator, the parasitic capacitive effect can be significantly restrained. Therefore, the phase interpolator provided herein can obtain the wide operation frequency range without reducing the maximum operation speed of the phase interpolator, so as to provide the phase interpolation signal with higher linearity and lower jitter.

It is to be understood that both the foregoing general description and the following detailed description are exemplary and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF THE EMBODIMENTS

Figure 1:
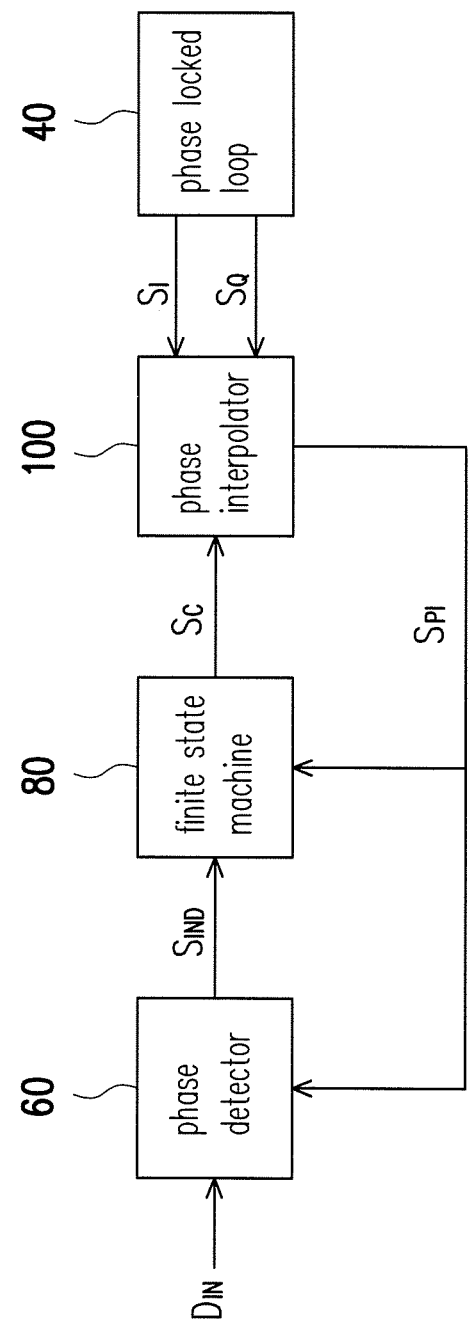
FIG. 1 is a block diagram of a clock and data recovery circuit according to an embodiment of the disclosure.

In order to make the disclosure more comprehensible, embodiments are described below as examples showing that the disclosure can actually be realized. The embodiments provided herein are only for an illustrative purpose, instead of limiting the scope of the disclosure. Moreover, wherever possible, the same reference numbers are used in the drawings and the description of embodiments to refer to the same or like parts.

FIG. 1 is a block diagram of a clock and data recovery circuit (CDR) according to an embodiment of the disclosure. In the present embodiment, the CDR circuit 10 can be disposed in a receiver for recovering clock of the input data received from a transmitter. With reference to FIG. 1, the CDR circuit 10 includes a phase locked loop (PLL) 40, a phase detector 60, a finite state machine (FSM) 80, and a phase interpolator 100. The PLL 40 is coupled to the phase interpolator 100 and generates a first clock signal $S_I$ and a second clock signal $S_Q$, the first clock signal $S_I$ is an in-phase signal, and the second clock signal $S_Q$ is an quadrature signal having the same frequency with and orthogonal to the first clock signal $S_I$. In other words, the first clock signal $S_I$ and the second clock signal $S_Q$ have a phase difference of 90 degrees.

The phase detector 60 is configured to compare an input data signal $D_{IN}$ with a phase interpolation signal $S_{PI}$ outputted by the phase interpolator 100 and generate a phase indication signal $S_{IND}$ to indicate a phase difference between the input data signal $D_{IN}$ and the phase interpolation signal $S_{PI}$. For example, the phase detector 60 can determine the phase difference between the input data signal $D_{IN}$ and the phase interpolation signal $S_{PI}$ by sampling voltages, nearing the rising edge or the falling edge, of the input data signal $D_{IN}$ and the phase interpolation signal $S_{PI}$ and comparing the sampled voltages to determine whether the phase of the input data signal $D_{IN}$ leads or falls behind the phase of the phase interpolation signal $S_{PI}$.

The FSM 80 is coupled to the phase detector 60 and generates a control signal $S_C$ according to the phase indication signal $S_{IND}$ and the phase interpolation signal $S_{PI}$, so as to control the interpolation operation of the phase interpolator 100.

The phase interpolator 100 is coupled to the phase detector 60 and the finite state machine 80 and performs the interpolation operation for generating the phase interpolation signal $S_{PI}$ according to the first and the second clock signals $S_I$ and $S_Q$ outputted from the PLL 40 and the control signal $S_C$ outputted from the FSM 80. In the present embodiment, owing to the phase interpolator 100 design, the wide operation frequency range can be obtained without reducing the maximum operation speed. This is because the parasitic capacitive effect can be significantly restrained by the circuit design of the phase interpolator 100.

Figure 2:
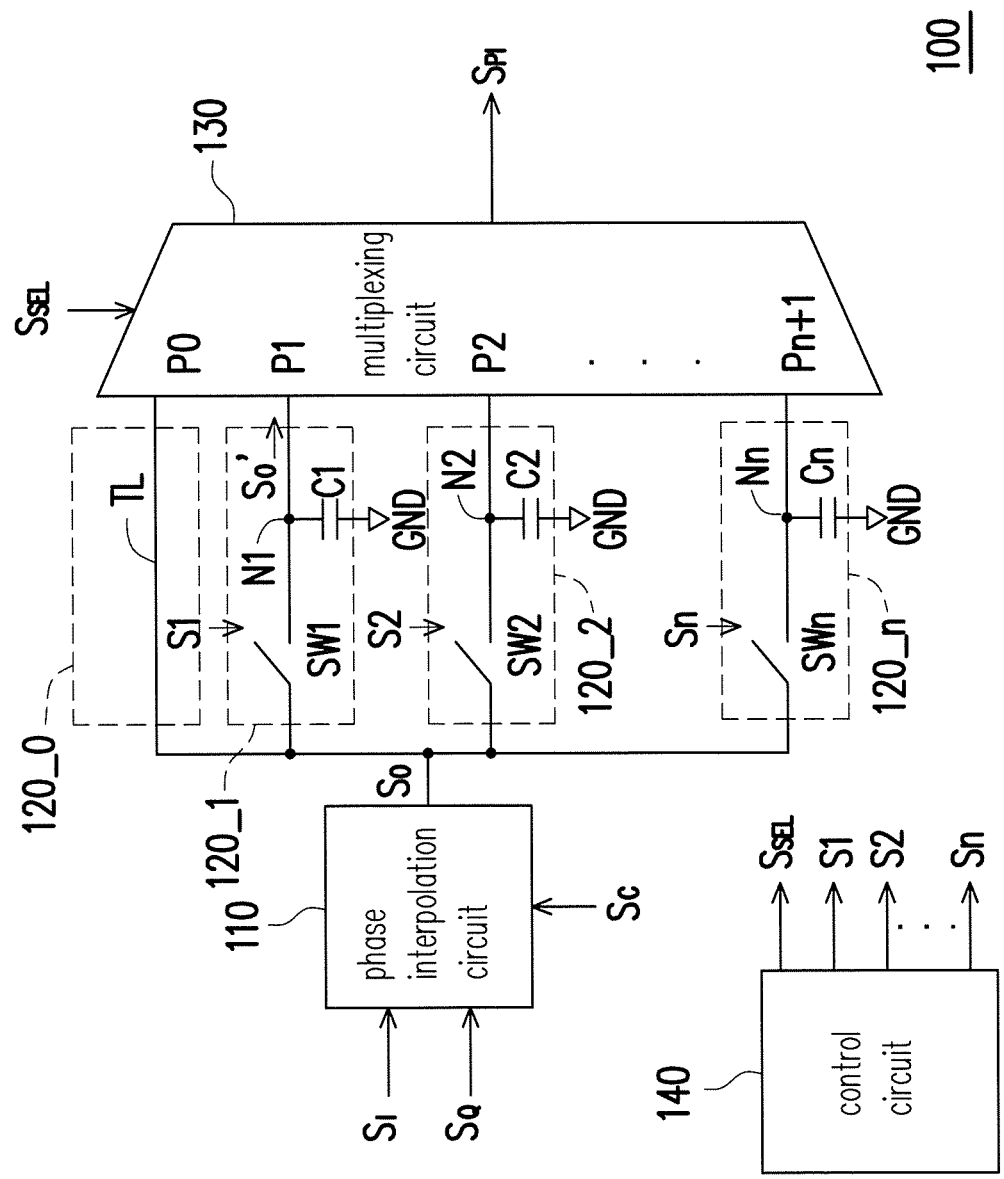
FIG. 2 is a circuit diagram of a phase interpolator according to an embodiment of the disclosure.

The following embodiment shown in FIG. 2 clarifies the circuit design of the phase interpolator 100. Specifically, FIG. 2 is a circuit diagram of a phase interpolator according to an embodiment of the disclosure.

The phase interpolator 100 includes a phase interpolation circuit 110, a direct transmission channel 120_0, a plurality of low pass filtering channels 120_1-120_n, a multiplexing circuit 130, and a control circuit 140.

The phase interpolation circuit 110 receives the first clock signal $S_I$ and the second clock signal $S_Q$ from the PLL 40 and accordingly performs an interpolation operation based on the control signal $S_C$ to generate the output clock signal $S_O$. More specifically, the phase interpolation circuit 110 may interpolate the first and the second clock signals $S_I$ and $S_Q$ based on a weighting value, where the weighting value is determined by the control signal $S_C$ outputted from the FSM 80 (referring to FIG. 1). In the present embodiment, the interpolated phase can be adjusted by tuning the weighting value, such that the phase of the output clock signal $S_O$ can be adjusted between the phase of the first clock signal $S_I$ and that of the second clock signal $S_Q$.

The direct transmission channel 120_0 and the low pass filtering channels 120_1-120_n are coupled in parallel and between the phase interpolation circuit 110 and the multiplexing circuit 130. Each of the direct transmission channel 120_0 and the low pass filtering channels 120_0-120_n has an input terminal and an output terminal. The input terminals of the direct transmission channel 120_0 and the low pass filtering channels 120_0-120_n are commonly connected to the output of the phase interpolation circuit 110 to receive the output clock signal $S_O$. The output terminals of the direct transmission channel 120_0 and the low pass filtering channels 120_0-120_n are respectively connected to input terminals P0-Pn+1 of the multiplexing circuit 130, where n is a positive integer and can be decided by the designer. The invention is not limited thereto.

In detail, the direct transmission channel 120_0 can be implemented by a transmission line TL for directly transmitting the output clock signal $S_O$ to the input terminal P0 of the multiplexing circuit 130. On the other hand, each of the low pass filtering channels 120_1-120_n can be implemented by a switch (e.g., any of the switches SW1-SWn) and a capacitor (e.g., any of the capacitors C1-Cn). The switch and the capacitor are coupled to a common node (e.g., any of the nodes N1-Nn) as the output terminal in each of the low pass filtering channels. For example, the switch SW1 and the capacitor C1 are coupled to node N1 as the output terminal of the low pass filtering channels 120_1, the switch SW2, and the capacitor C2 are coupled to the node N2 as the output terminal of the low pass filtering channel 120_2, the switch SWn and the capacitor Cn are coupled to the node Nn as the output terminal of the low pass filtering channel 120_n, and so on.

More specifically, taking the low pass filtering channel 120_1 as an example, the switch SW1 in the low pass filtering channel 120_1 has a first terminal, a second terminal, and a control terminal. The first terminal of the switch SW1 is coupled to the output of the phase interpolation circuit 110. The second terminal of the switch SW1 is coupled to the input terminal P1 of the multiplexing circuit 130 via the common node N1. The control terminal of the switch SW1 is coupled to the control circuit 140 to receive a switch signal S1. The capacitor C1 in the low pass filtering channel 120_1 has a first terminal and a second terminal. The first terminal of the capacitor C1 is coupled to the second terminal of the switch SW1 (i.e., the common node N1). The second terminal of the capacitor C1 is coupled to a ground terminal GND. It should be noted that the ground terminal GND is not limited to the absolute zero voltage potential (i.e., earth potential). The ground terminal GND in the present embodiment means a part having the lowest and stable voltage potential, relative to the other parts, in the phase interpolator 100.

Circuit structures of the other low pass filtering channels 120_2-120_n can be deduced by analogy and thus are not further explained hereinafter. In the present embodiment, the capacitors C1-Cn of the low pass filtering channels 120_1~120_n have different capacitances. For example, the capacitance of the capacitor C1 is $2^0 \times C$, where C represents a specific capacitance value set according to circuit design requirements, the capacitance of the capacitor C2 is $2^1 \times C$, the capacitance of the capacitor Cn is $2^{n-1} \times C$, and so on.

Since the direct transmission channel 120_0 and each of the low pass filtering channels 120_1-120_n have different effective capacitances, one of the low pass filtering channels 120_0-120_n may be selected for transmitting the output clock signal $S_O$ to the multiplexing circuit 130 so as to meet the requirements for the frequency of the first clock signal $S_I$ and the second clock signal $S_Q$. For example, if n is assumed to be equal to 4, and if the phase interpolation circuit 110 receives the first and the second clock signals $S_I$ and $S_Q$ with a first frequency (e.g., 1 GHz), the switch SW4 coupled to the capacitor C4 with higher capacitance (e.g., $2^3 \times C = 8C$) is turned on in response to the switch signal S4. On the other hand, when the phase interpolation circuit 110 receives the first and the second clock signals $S_I$ and $S_Q$ with a second frequency higher than the first frequency (e.g., 20 GHz), the switch SW1 coupled to the capacitor C1 with lower capacitance (e.g., $2^0 \times C = C$) is turned on in response to the switch signal S1. Further, when the phase interpolation circuit 110 receives the first and the second clock signals $S_I$ and $S_Q$ with a third frequency further higher than the second frequency (e.g., 32 GHz), the switches SW1-SW4 may all be turned off in response to the switch signals S1-S4, so as to transmit the output clock signal $S_O$ to the input terminal of the multiplexing circuit 130 via the direct transmission channel 120_0 which has the lowest effective capacitance.

The multiplexing circuit 130 has a plurality of input terminals P1-Pn+1 respectively coupled to the output terminals of the direct transmission channel 120_0 and the low pass filtering channels 120_1-120_n, and the multiplexing circuit 130 selects an input signal (e.g., an input signal $S_O'$) received from one of the low pass filtering channels as a phase interpolation signal $S_{PI}$ according to a selecting signal $S_{SEL}$.

The control circuit 140 is coupled to the low pass filtering channels 120_1-120_n and the multiplexing circuit 130. The control circuit provides the switch signals S1-Sn respectively to the switches SW1-SWn, and provides the selecting signal $S_{SEL}$ to the multiplexing circuit 130.

As to the interpolation operation of the entire phase interpolator 100, taking the low pass filtering channel 120_1 as an example, if the low pass filtering channel 120_1 has been selected according to the frequency of the input data signal $D_{IN}$ (referring to FIG. 1), the control circuit 140 may provide the enabled switch signal S1 to turn on the switch SW1 and the disabled switch signal S2-Sn to turn off the switches SW2-SWn. In addition, the control circuit 140 may further provide the corresponding selecting signal $S_{SEL}$, such that the multiplexing circuit 130 selects the input signal $S_O'$ received from the output terminal of the low pass filtering channel 120_1 as the phase interpolation signal $S_{PI}$.

In other words, when the multiplexing circuit 130 selects the input signal $S_O'$ received from the low pass filtering channel 120_1 as the phase interpolation signal $S_{PI}$ according to the selecting signal $S_{SEL}$, the switch SW1 of the low pass filtering channel 120_1 is turned on in response to the switch signal S1, and the switches SW2-SWn of the rest of the low pass filtering channels 120_2-120_n are turned off in response to the corresponding switch signals S2-Sn.

In the present embodiment, since the phase interpolation signal $S_{PI}$ outputted from the multiplexing circuit 130 is provided from the common node N1, which is electrically disconnected from the other common nodes N2-Nn in the other low pass filtering channels 120_2-120_n, the parasitic capacitors of the other low pass filtering channel 120_2-120_n may not reduce the maximum operation speed of the phase interpolator 100. In addition, the wide operation frequency range can be obtained by selecting one of the low pass filtering channels 120_0-120_n (with different capacitances) as a transmitting channel.

Furthermore, a transfer function of the output clock signal $S_O$ and the input signal $S_O'$/the phase interpolation signal $S_{PI}$ can be expressed by following equations:

$$S_O = V_{PI} \cdot \frac{1}{1 + \omega \, R_{PI} C_{PI}} \quad (1)$$

$$S_{PI} = S_O' = S_O \cdot \frac{1}{1 + \omega \, R_{SW} C} \quad (2)$$

Here, $V_{PI}$ is the amplitude of the output clock signal $S_O$, $\omega$ is the frequency of the output clock signal $S_O$, $R_{PI}$ is the effective output resistance of the phase interpolation circuit 110, $C_{PI}$ is the effective capacitance of the phase interpolation circuit 110, $R_{SW}$ is the effective resistance of the switch SW1, and C is the capacitance of the capacitor C1.

According to the equations (1) and (2), the resistance $R_{SW}$ of the switch SW1 not only provides a pole in the transfer function of the input signal $S_O'$ but isolates the parasitic capacitor to achieve high speed operation. Besides, the transfer function of the input signal $S_O'$ generated by each of the low pass filtering channels 120_1-120_n may have the same equation but different capacitances.

The phase interpolation signal $S_{PI}$, if practically applied and generated by the phase interpolator 100, has high linearity and low jitter between 1 Gbps and 32 Gbps.

In summary, the embodiments of the invention provide a phase interpolator and a clock and data recovery circuit using the same. Because of the circuit structure of a plurality of low pass filtering channels in the phase interpolator provided herein, the parasitic capacitive effect can be significantly restrained. Therefore, the phase interpolator can obtain the wide operation frequency range without reducing the maximum operation speed of the phase interpolator, so as to provide the phase interpolation signal with higher linearity and lower jitter.

Note that the above-mentioned receiver circuit may be applied in any chip operated at, for example, a low voltage of 1.8V, but the invention is not limited thereto; other exemplary embodiments (for example, changing the n-channel MOS transistors to the p-channel MOS transistors) also fall within the scope of the invention.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A phase interpolator comprising:
   a phase interpolation circuit receives a first clock signal and a second clock signal and accordingly performs an interpolation operation based on a weighting value set to the phase interpolation circuit to generate an output clock signal;
   a plurality of low pass filtering channels respectively having an input terminal and an output terminal, the input terminal being coupled to the phase interpolation circuit to receive the output clock signal, wherein each of the low pass filtering channels comprises a switch and a capacitor, wherein a first terminal of the switch is regarded as the input terminal, and a second terminal of the switch and a first terminal of the capacitor are coupled to a common node as the output terminal, and the switch is controlled by a corresponding switch signal; and
   a multiplexing circuit having a plurality of input terminals respectively coupled to the output terminals of the low pass filtering channels, wherein the multiplexing circuit selects an input signal received from one of the low pass filtering channels as a phase interpolation signal according to a selecting signal.

2. The phase interpolator according to claim 1, further comprising:
   a control circuit coupled to the low pass filtering channels and the multiplexing circuit, the control circuit provides the switch signals and the selecting signal.

3. The phase interpolator according to claim 1, wherein when the multiplexing circuit selects the input signal received from the one of the low pass filtering channels as the phase interpolation signal according to the selecting signal, the switch of the one of the low pass filtering channels is turned on in response to the corresponding switch signal, and the switches of the rest of the low pass filtering channels are turned off in response to the corresponding switch signals.

4. The phase interpolator according to claim 1, wherein each of the low pass filtering channels comprises:
   the switch having the first terminal coupled to the phase interpolation circuit, the second terminal coupled to the corresponding input terminal of the multiplexing circuit, and a control terminal receives the corresponding switch signal; and
   the capacitor having the first terminal and a second terminal, the first terminal of the capacitor being coupled to the second terminal of the switch and the input terminal of the multiplexing circuit, the second terminal of the capacitor being coupled to a ground terminal.

5. The phase interpolator according to claim 1, wherein the capacitors of the low pass filtering channels have different capacitances.

6. The phase interpolator according to claim 5, wherein when the phase interpolation circuit receives the first and the second clock signals with a first frequency, the switch coupled to the capacitor with a first capacitance is turned on in response to the corresponding switch signal, and when the phase interpolation circuit receives the first and the second clock signals with a second frequency higher than the first frequency, the switch coupled to the capacitor with a second capacitance lower than the first capacitance is turned on in response to the corresponding switch signal.

7. The phase interpolator according to claim 6, further comprising:
   a direct transmission channel coupled between the phase interpolation circuit and the multiplexing circuit, the direct transmission channel directly transmits the output clock signal to the corresponding input terminal of the multiplexing circuit.

8. The phase interpolator according to claim 7, wherein when the phase interpolation circuit receives the first and the second clock signals with a third frequency higher than the second frequency, the switches of the low pass filtering channels are turned off in response to the corresponding switch signals, such that the output clock signal is provided to the input terminal of the multiplexing circuit via the direct transmission channel.

9. A clock and data recovery circuit comprising:
   a phase detector comparing an input data signal with a phase interpolation signal and generates a phase indication signal to indicate a phase difference between the input data signal and the phase interpolation signal;
   a finite state machine coupled to the phase detector, the finite state machine generates a control signal according to the phase indication signal and the phase interpolation signal; and
   a phase interpolator coupled to the phase detector and the finite state machine, the phase interpolator generating the phase interpolation signal according to a first clock signal, a second clock signal, and the control signal, wherein the phase interpolator comprises:
      a phase interpolation circuit receives the first and the second clock signals and accordingly performs an interpolation operation according to the control signal to generate an output clock signal;
      a plurality of low pass filtering channels respectively having an input terminal and an output terminal, the input terminal being coupled to the phase interpolation circuit to receive the output clock signal, wherein each of the low pass filtering channels comprises a switch and a capacitor, wherein a first terminal of the switch is regarded as the input terminal, and a second terminal of the switch and a first terminal of the capacitor are coupled to a common node as the output terminal, and the switch is controlled by a corresponding switch signal; and a multiplexing circuit having a plurality of input terminals respectively coupled to the output terminals of the low pass filtering channels, wherein the multiplexing circuit selects an input signal received from one of the low pass filtering channels as the phase interpolation signal according to a selecting signal.

10. The clock and data recovery circuit according to claim 9, further comprising:
a phase-locked loop coupled to the phase interpolator, the phase-locked loop generates the first and the second clock signals.

11. The clock and data recovery circuit according to claim 9, wherein the phase interpolator further comprises:
a control circuit coupled to the low pass filtering channels and the multiplexing circuit, the control circuit provides the switch signals and the selecting signal.

12. The clock and data recovery circuit according to claim 9, wherein when the multiplexing circuit selects the input signal received from the one of the low pass filtering channels as the phase interpolation signal according to the selecting signal, the switch of the one of the low pass filtering channels is turned on in response to the corresponding switch signal, and the switches of the rest of the low pass filtering channels are turned off in response to the corresponding switch signals.

13. The clock and data recovery circuit according to claim 9, wherein each of the low pass filtering channels comprises:
the switch having the first terminal coupled to the phase interpolation circuit, the second terminal coupled to the corresponding input terminal of the multiplexing circuit, and a control terminal receives the corresponding switch signal; and
the capacitor having the first terminal and a second terminal, the first terminal of the capacitor being coupled to the second terminal of the switch and the input terminal of the multiplexing circuit, the second terminal of the capacitor being coupled to a ground terminal.

14. The clock and data recovery circuit according to claim 9, wherein the capacitors of the low pass filtering channels have different capacitances.

15. The clock and data recovery circuit according to claim 14, wherein when the phase interpolation circuit receives the first and the second clock signals with a first frequency, the switch coupled to the capacitor with a first capacitance is turned on in response to the corresponding switch signal, and when the phase interpolation circuit receives the first and the second clock signals with a second frequency higher than the first frequency, the switch coupled to the capacitor with a second capacitance lower than the first capacitance is turned on in response to the corresponding switch signal.

16. The clock and data recovery circuit according to claim 15, wherein the phase interpolator further comprises:
a direct transmission channel coupled between the phase interpolation circuit and the multiplexing circuit, the direct transmission channel directly transmits the output clock signal to the corresponding input terminal of the multiplexing circuit.

17. The clock and data recovery circuit according to claim 16, wherein when the phase interpolation circuit receives the first and the second clock signals with a third frequency higher than the second frequency, the switches of the low pass filtering channels are turned off in response to the corresponding switch signals, such that the output clock signal is provided to the input terminal of the multiplexing circuit via the direct transmission channel.

* * * * *